(12) United States Patent
Park

(10) Patent No.: US 11,713,614 B2
(45) Date of Patent: Aug. 1, 2023

(54) CONDENSATION PREVENTION TYPE TRANSMISSION WINDOW FOR CMS MODULE TEST CHAMBER

(71) Applicants: SP Technology Co., Ltd., Anyang-si (KR); Yong Jin Park, Uiwang-si (KR)

(72) Inventor: Yong Jin Park, Uiwang-si (KR)

(73) Assignee: SP TECHNOLOGY CO., LTD.

( * ) Notice: Subject to any disclaimer, the term of this patent is extended or adjusted under 35 U.S.C. 154(b) by 769 days.

(21) Appl. No.: 16/666,648

(22) Filed: Oct. 29, 2019

(65) Prior Publication Data
US 2020/0224488 A1     Jul. 16, 2020

(30) Foreign Application Priority Data

Jan. 11, 2019   (KR) ................. 10-2019-0003751

(51) Int. Cl.
| | | |
|---|---|---|
| *E06B 7/12* | (2006.01) | |
| *H05B 3/86* | (2006.01) | |
| *E06B 5/00* | (2006.01) | |
| *G01M 11/02* | (2006.01) | |
| *G01R 31/28* | (2006.01) | |
| *H04N 1/00* | (2006.01) | |
| *G01N 17/00* | (2006.01) | |

(52) U.S. Cl.
CPC .................. *E06B 7/12* (2013.01); *E06B 5/00* (2013.01); *G01N 17/002* (2013.01); *H04N 1/00992* (2013.01); *H05B 3/86* (2013.01); *G01M 11/02* (2013.01); *G01R 31/2844* (2013.01)

(58) Field of Classification Search
CPC . H05B 3/84; H05B 3/86; G01N 17/00; G01N 17/002; G01M 11/02; H04N 1/00992; G01R 31/2844
See application file for complete search history.

(56) References Cited

U.S. PATENT DOCUMENTS 6,353,474 B1 * 3/2002 Kucharski ............. G01C 11/02
                                                            348/81
8,393,234 B2 * 3/2013 Haefner ............... G01N 21/645
                                                            73/864.91
(Continued)

FOREIGN PATENT DOCUMENTS

KR              965187 B1 *  6/2010
KR          101082402 B1 * 11/2011

*Primary Examiner* — Jason Crawford
(74) *Attorney, Agent, or Firm* — Park & Associates IP Law Office

(57) ABSTRACT

The present invention is related to a condensation prevention type transmission window for a CMS module test chamber, the transmission window being provided at the module test chamber. The condensation prevention type transmission window includes: a multilayer glass panel in which heating wires are coated on upper, lower, left, and right side surfaces thereof; and an air injector provided at each of opposite surfaces of the transmission window to inject air from an upper side edge and/or a lower side edge of the transmission window and to form an air curtain. The present invention provides the condensation prevention type transmission window for a CMS module test chamber, which prevents freezing and fogging on inside and outside surfaces of the transmission window of the CMS module test chamber varying in a temperature range from 40° C. to +125° C.

4 Claims, 6 Drawing Sheets

(56) References Cited

U.S. PATENT DOCUMENTS

| | | | |
|---|---|---|---|
| 11,394,955 B2* | 7/2022 | Baar | H04N 23/56 |
| 2003/0046887 A1* | 3/2003 | Chubb | E06B 7/30 |
| | | | 49/504 |
| 2005/0202178 A1* | 9/2005 | Roche | C03C 17/322 |
| | | | 427/385.5 |
| 2011/0285857 A1* | 11/2011 | He | H04N 17/002 |
| | | | 348/E17.002 |
| 2017/0167967 A1* | 6/2017 | Bugher | G01N 17/002 |
| 2019/0004415 A1* | 1/2019 | Huang | G03B 43/00 |
| 2020/0224488 A1* | 7/2020 | Park | H04N 1/00992 |
| 2020/0267953 A1* | 8/2020 | Wendeler-Goeggelmann | |
| | | | B21F 27/00 |
| 2021/0138450 A1* | 5/2021 | Terao | B01L 1/025 |
| 2021/0372880 A1* | 12/2021 | Chang | G01M 11/0257 |
| 2022/0070438 A1* | 3/2022 | Cho | G01M 11/0214 |

* cited by examiner

CONDENSATION PREVENTION TYPE TRANSMISSION WINDOW FOR CMS MODULE TEST CHAMBER

REFERENCE TO RELATED APPLICATIONS

This application claims the priority benefit of Korean Patent Application No. 10-2019-0003751 filed on Jan. 11, 2019, the entire contents of which are incorporated herein by reference.

FIELD OF THE INVENTION

The present invention relates generally to a condensation prevention type transmission window for a camera monitor system (CMS) module test chamber. More particularly, the present invention relates to a transmission window for a CMS module test chamber. Wherein an air injection direction is controlled in conjunction with temperature variation between inside and outside temperatures of the CMS module test chamber, and the temperature of a transmission window frame is easily controlled.

BACKGROUND OF THE INVENTION

A CMS module test chamber 100 of the present invention has a variable inside temperature, and a CMS module is inserted in the CMS module test chamber 100.

The CMS module is a camera monitor system module. The camera monitor system module is a device that combines a camera and a monitor to secure front, rear, and side views of a vehicle. The CMS is similar to a rear camera showing the rear of a vehicle, but has difference in that the CMS module replaces rear view mirrors.

The Ministry of Land, Infrastructure, and Transport (Korea) announced a legislative notice in June 2016 to enable the installation of the camera monitor system (CMS) for a vehicle in replacement of rear view mirrors, and the bill passed in January 2017.

Accordingly, in the domestic automotive industry, a CMS measurement apparatus capable of measuring optical characteristics of the CMS according to international regulations is required when the CMS replacing the rear view mirrors is manufactured.

That is, for legal installation of the CMS, there is a need to develop measurement technology and equipment that may accurately and reliably measure optical characteristics of the CMS on the basis of the revised UN R. 46.

The CMS module test chamber 100 is equipment that measures optical characteristics of the CMS in a situation where the temperature may vary to the extreme considering that optical characteristics of the CMS are sensitive to temperature.

A CMS reliability test assesses how long the CMS lasts in the environment. The test includes: an environmental test that evaluates operation life, initial failure like, high/low temperature storage, temperature and humidity, high humidity and high pressure, and temperature cycle; a mechanical and physical test such as shock and vibration, and a static test that evaluates resistance from static that is major failure of semiconductors.

In particular, a test for checking operation of the CMS according to the temperature cycle is a test for evaluating whether electronics of the CMS are operated properly at a specific temperature. In the test, expensive foreign equipment is used, so it may be difficult to perform modify, upgrade, or after-sale service on domestic customer's demands.

In order to efficiently perform the optical characteristic test without time loss, both the CMS to be tested and the measurement equipment may be placed inside the CMS module test chamber 100 to measure the optical characteristic. In addition, the CMS may be separated from the measurement equipment and placed inside the CMS module test chamber 100 in which a lower reflection or high transmission optical window (that is, transmission window of the present invention) and then the optical characteristic may be measured by the measurement equipment placed outside the CMS module test chamber 100.

In the former method, there is a limitation that the measurement equipment should be operated without problems in a temperature range required for the test. However, since the measurement equipment is also precision optical equipment, it is difficult to secure reliability in the temperature range.

In particular, CMS modules exposed to direct sunlight are tested in a temperature range from −40° C. to +125° C. based on ACE Q100, so it is difficult to secure reliability of the measurement equipment in the temperature condition.

Therefore, a general CMS module test is performed by the latter method. In the latter method, the CMS module test chamber 100 in which the temperature varies in the temperature range from −40° C. to +125° C. is provided, the CMS module to be tested is mounted inside the CMS module test chamber 100, the lower reflection optical window (Hereinbelow, that is referred to as 'transmission window') is mounted to the CMS module test chamber 100 to measure the optical characteristics of the CMS module without distortions, and the measurement equipment is installed outside the CMS module test chamber 100 to measure the optical characteristics of the CMS module through the transmission window.

However, in the latter method, since air flows into the CMS module test chamber 100 in an extremely low temperature condition such as −40° C., condensation occurs on the transmission window, thus it is difficult to perform a normal test.

In order to solve the problem, the related arts have proposed a method of manufacturing a transmission window made of a multilayer glass panel and adiabatic-treated and a method of forming a heating wire between the multilayer glass panel or at the transmission window.

A method of forming a heating wire between multilayer glass panel disclosed in Korean Patent No. 10-0628981 'Overlap glass window equipped with heating wire' is a known art.

Korean Patent No. 10-0965187 'Camera test system capable of testing under worst case' discloses a method for a transmission window for a CMS module test chamber same as the present invention. Wherein a heating wire is used to solve the condensation and is configured to be disposed between multilayer glass panel.

In the current known arts, since the heating wire is separately installed, a manufacturing process is complicated, and heating efficiency varies depending on the process.

In addition, the heating wire is provided to block heat transmitted to a transmission window frame. However, according to the related arts, it is difficult to solve condensation due to difference of relative humidity between the temperature of air contacting with a surface of the transmission window and the temperature of the transmission window.

In particular, since the temperature of the CMS module test chamber 100 varies in the temperature range from −40° C. to +125° C., a surface temperature outside the CMS module test chamber 100 becomes relatively an extremely low state or an extremely high state depending on the temperature range from −40° C. to +125° C. of the CMS module test chamber 100. Accordingly, there is a need to solve condensation or fogging.

SUMMARY OF THE INVENTION

Accordingly, the present invention has been made keeping in mind the above problems occurring in the related art, and the present invention is intended to propose a condensation prevention type transmission window for a CMS module test chamber. Wherein freezing and fogging at inside and outside surfaces of the transmission window of the CMS module test chamber 100 in which the inside temperature varies from −40° C. to +125° C. are prevented.

In order to achieve the above object, according to one aspect of the present invention, there is provided a condensation prevention type transmission window for a CMS module test chamber, the transmission window being provided at the module test chamber, the transmission window includes: a multilayer glass panel in which heating wires are coated on upper, lower, left, and right side surfaces thereof.

At each of opposite side surfaces of the transmission window, an air injector may be provided on an upper side edge and/or a lower side edge thereof, wherein the air injector may inject air to form an air curtain on the transmission window.

The air injector may include: an upper air injection pipe provided at the upper side edge of the transmission window and having a nozzle that injects air toward a lower side of the transmission window; a lower air injection pipe provided at the lower side edge of the transmission window and having a nozzle that injects air toward an upper side of the transmission window; and a flow path selection control valve provided at a branching point on a main air flow path, the branching point at which air is branched into the upper air injection pipe and the lower air injection pipe. Wherein the flow path selection control valve may be controlled on the basis of temperature of air contacting with the transmission window, such that when the temperature is low, air may be injected from the lower air injection pipe and, and when the temperature is high, air may be injected from the upper air injection pipe, so the air curtain may be spread out on the transmission window.

Further, the transmission window may include: a temperature sensor provided at each of opposite sides of the transmission window to sense temperature; and a controller receiving sensing information of the temperature sensor and outputting a path switching command to the flow path selection control valve. Wherein an air injection flow path may be automatically selected by the flow path selection control valve on the basis of temperatures of air contacting with the opposite side surfaces of the transmission window, and air injectors on the opposite side surfaces may be individually controlled from each other on the basis of the temperatures of air contacting with the opposite side surfaces of the transmission window.

Further, the transmission window may include: a heating wire current control circuit configured to control heating temperatures of the heating wires in response to a control command of the controller; and a frame temperature sensor checking a temperature of a transmission window frame. Wherein the temperature of the transmission window frame is controlled by the controller.

Further, the transmission window may include air walls protruding from left and right sides of the opposite side surfaces thereof to allow injected air to form air layers.

According to the present invention, there is provided the condensation prevention type transmission window for the CMS module test chamber, which prevents freezing and fogging at the inside and outside surfaces of the transmission window of the CMS module test chamber 100 in which the inside temperature varies from −40° C. to +125° C.

BRIEF DESCRIPTION OF THE DRAWINGS

The above and other objects, features, and other advantages of the present invention will be more clearly understood from the following detailed description when taken in conjunction with the accompanying drawings, in which.

DETAILED DESCRIPTION OF THE INVENTION

Figure 1:
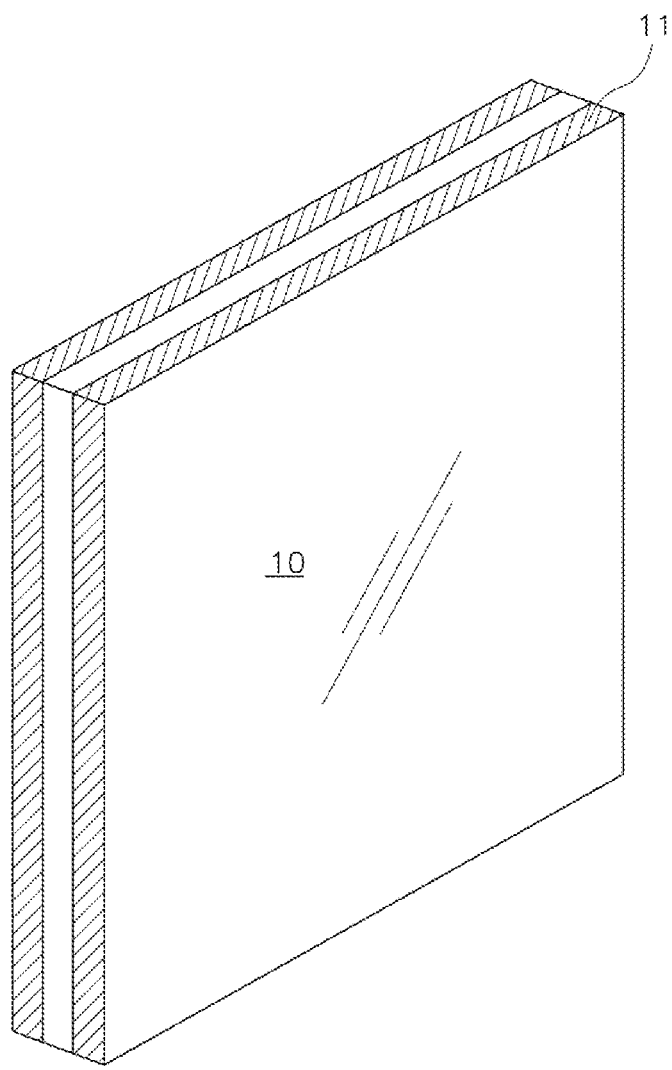
FIG. 1 is a perspective view showing a multilayer glass panel of the present invention.

Hereinbelow, an exemplary embodiment of the present invention will be described in detail with reference to the accompanying drawings. In the following description, if it is decided that the detailed description of known art or configuration related to the invention makes the subject matter of the invention unclear, the detailed description is omitted.

Further, technical terms, as will be mentioned hereinafter, are terms defined in consideration of their function in the present invention, which may be varied according to the intention of a user, practice, or the like, so that the terms should be defined based on the contents of this specification.

The present invention relates to a transmission window for a camera monitor system (CMS) module test chamber, and the transmission window includes: a multilayer glass panel in which heating wires 11 are provided; an air injector 400 configured of nozzles 200 and 300, an upper air injection pipe 20, a lower air injection pipe 30, a main air flow path 40, and a flow path selection control valve 50; and a temperature sensor 60, a heating wire current control circuit 80, a frame temperature sensor 90, and a controller 70.

Figure 2:
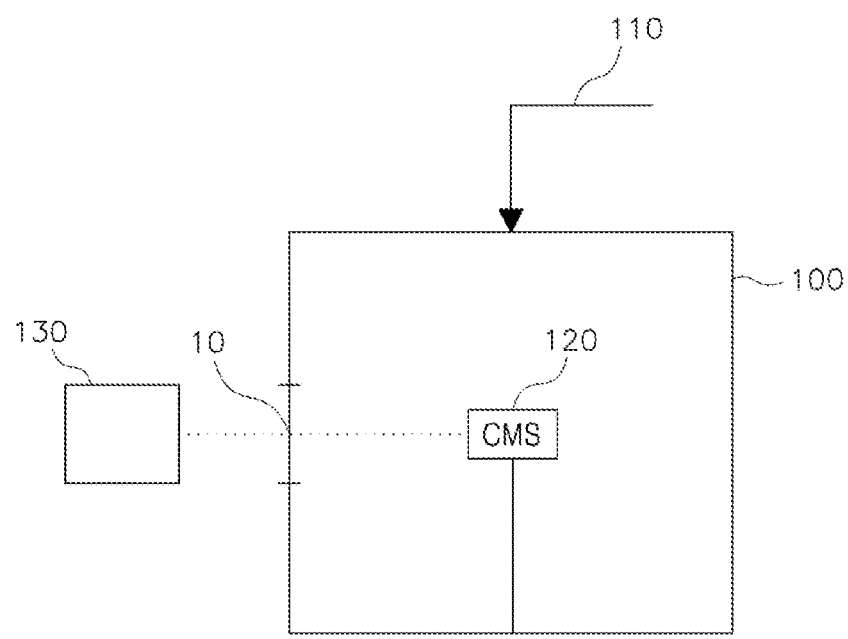
FIG. 2 is a schematic diagram showing a structure of a CMS module test chamber 100 of the present invention.

As shown in FIG. 2, the CMS module test chamber 100 of the present invention has a variable inside temperature. Specifically, the CMS module test chamber 100 is a test chamber in which a CMS module 120 is mounted.

The CMS module 120 is a camera monitor system module, specifically, a vehicle CMS module.

A CMS is a device that combines a camera and a monitor to secure front, rear, and side views of a vehicle. The CMS is similar to a rear camera showing the rear of a vehicle, but has difference in that the CMS module replaces rear view mirrors.

The Ministry of Land, Infrastructure, and Transport (Korea) announced a legislative notice in June 2016 to enable the installation of the camera monitor system (CMS) for a vehicle in replacement of rear view mirrors, and the bill passed in January 2017.

Accordingly, in the domestic automotive industry, a CMS measurement apparatus capable of measuring optical characteristics of the CMS according to international regulations is required when the CMS replacing the rear view mirrors is manufactured.

That is, for legal installation of the CMS, there is a need to develop measurement technology and equipment that may accurately and reliably measure optical characteristics of the CMS on the basis of the revised UN R. 46.

The CMS module test chamber 100 is equipment that measures optical characteristics of the CMS in a situation where the temperature may vary to the extreme, considering that optical characteristics of the CMS are sensitive to temperature.

A CMS reliability test assesses how long the CMS lasts in the environment. The test includes: an environmental test that evaluates operation life, initial failure like, high/low temperature storage, temperature and humidity, high humidity and high pressure, and temperature cycle; a mechanical and physical test such as shock and vibration, and a static test that evaluates resistance from static that is major failure of semiconductors.

In particular, a test for checking operation of the CMS according to the temperature cycle is a test for evaluating whether electronics of the CMS are operated properly at a specific temperature. The test is performed by expensive foreign equipment, so it may be difficult to perform modify, upgrade, or after-sale service on domestic customer's demands.

In order to efficiently perform the optical characteristic test without time loss, both the CMS to be tested and the measurement equipment may be placed inside the CMS module test chamber 100 to measure the optical characteristic. In addition, the CMS may be separated from the measurement equipment and placed inside the CMS module test chamber 100 in which a lower reflection or high transmission optical window (that is, transmission window of the present invention) and then the optical characteristic may be measured by the measurement equipment placed outside the CMS module test chamber 100.

In the former method, there is a limitation that the measurement equipment should be operated without problems in a temperature range required for the test. However, since the measurement equipment is also precision optical equipment, it is difficult to secure reliability in the temperature range.

In particular, CMS modules exposed to direct sunlight are tested in a temperature range from −40° C. to +125° C. based on ACE Q100, so it is difficult to secure reliability of the measurement equipment in the temperature condition.

Therefore, as shown in FIG. 2, a general CMS module test is performed by the latter method. In the latter method, the CMS module test chamber 100 in which the temperature varies in the temperature range from −40° C. to +125° C. is provided, the CMS module 120 to be tested is mounted inside the CMS module test chamber 100, the lower reflection optical window (Hereinbelow, that is referred to as 'transmission window 10') is mounted to the CMS module test chamber 100 to measure the optical characteristics of the CMS module 120 from the outside of the CMS module test chamber 100 without distortions, and the measurement equipment 130 is installed outside the CMS module test chamber 100 to measure the optical characteristics of the CMS module 120 through the transmission window 10.

However, in the latter method, since air flows into the CMS module test chamber 100 in an extremely low temperature condition such as −40° C., condensation occurs on the transmission window 10, thus it is difficult to perform a normal test.

As shown in FIG. 1, the present invention is characterized in that the heating wires 11 are coated on upper, lower, left, and right side surfaces of the flat glass panel forming the transmission window 10.

According to a configuration of the present invention, an operation of wire formation on the transmission window 10 is performed only by a process of forming a multilayer glass panel using the flat glass panel. The heating wires 11 are formed at a portion that is directly in contact with a transmission window frame 13, thereby easily controlling the temperature of the transmission window frame 13.

In general, the inside temperature of the CMS module test chamber 100 varies greatly. Therefore, when temperature difference between the inside and the outside of the CMS module test chamber 100 is increased, condensation may occur on inside and outside surfaces of the transmission window 10 due to heat transfer through the transmission window frame 13.

When the inside of the CMS module test chamber 100 is in a completely dehumidified state, condensation may also occur on an outside surface of the CMS module test chamber 100 due to cold air transmitted through the transmission window frame 13. According to the present invention, the transmission window 10 preventing inside and outside condensation of the CMS module test chamber 100 may be easily formed.

Figure 3:
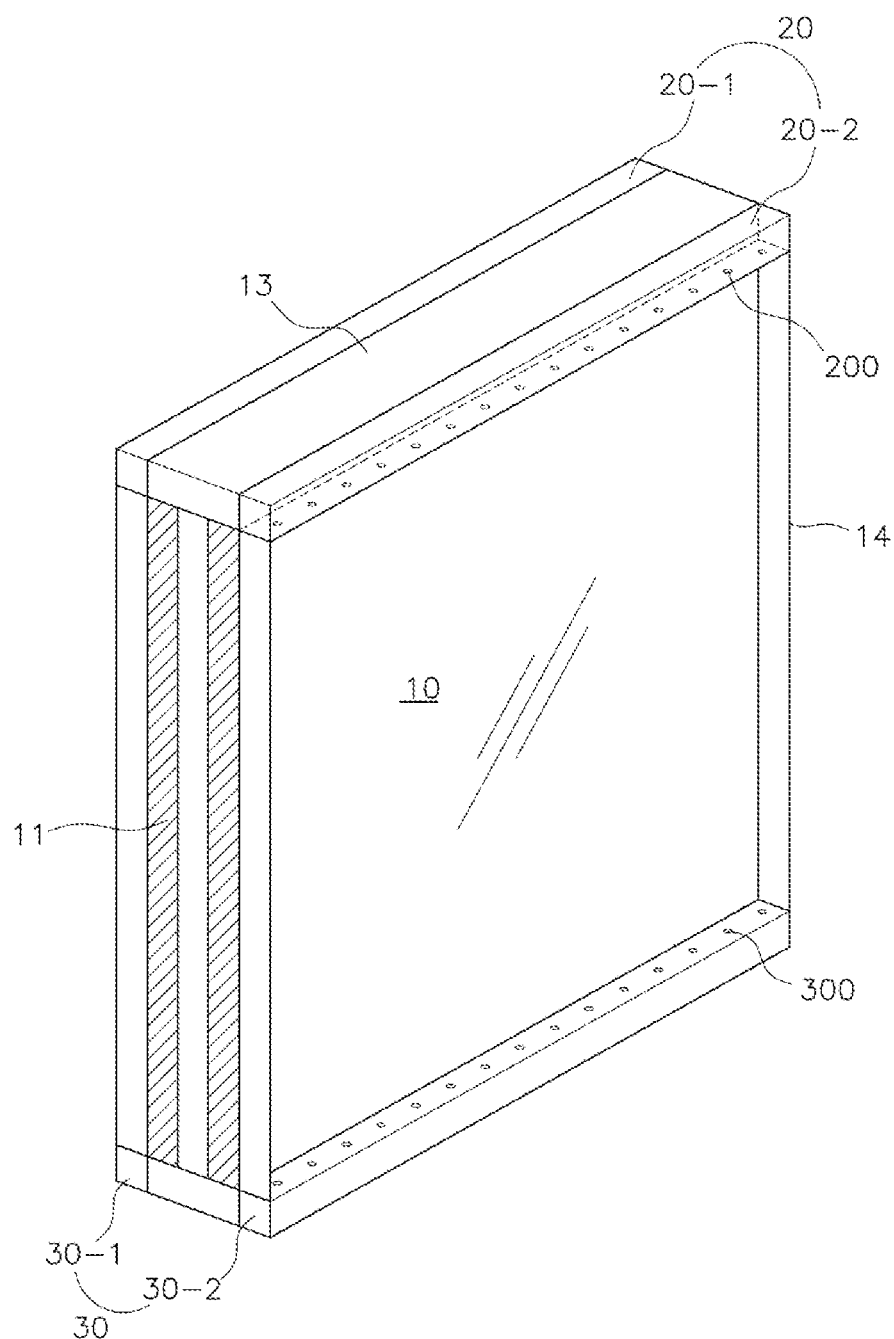
FIG. 3 is a perspective view showing a transmission window according to an embodiment of the present invention.
Figure 4:
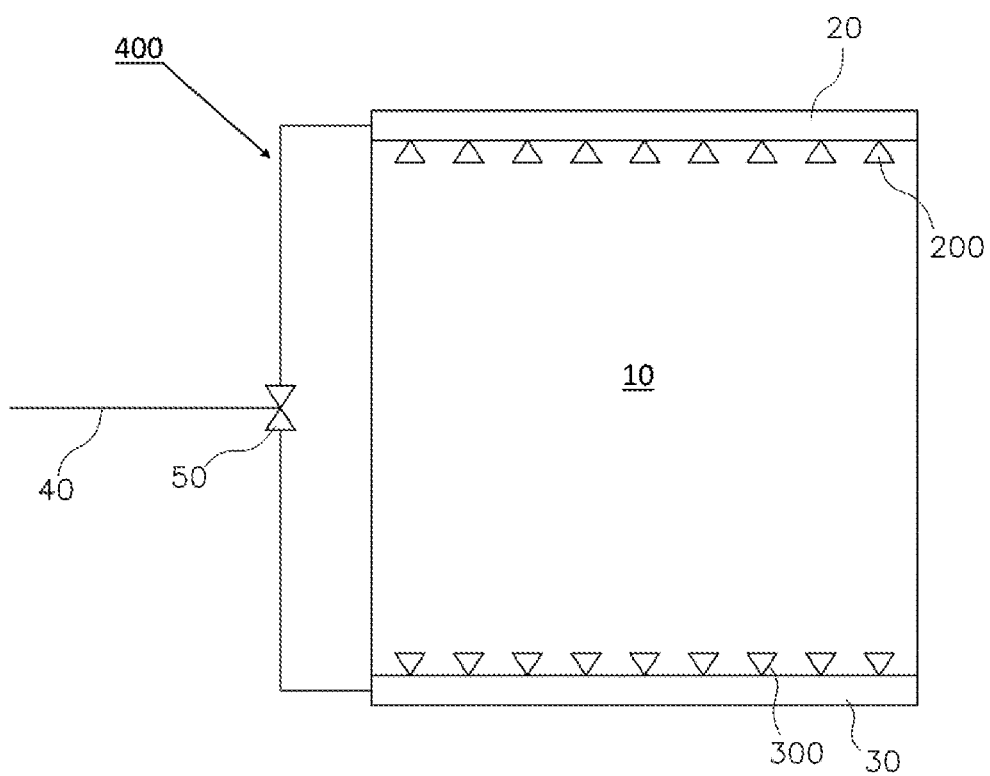
FIG. 4 is a schematic diagram showing a side structure of the transmission window according to the embodiment of the present invention.

In addition, the present invention is characterized in that the air injector 400 is provided at each of opposite side surfaces of the transmission window 10, as shown in FIGS. 3 and 4.

The air injector 400 is provided at an upper side edge and/or a lower side edge of the transmission window 10 to inject air from the upper side edge of the transmission window 10 to the lower side edge thereof or from the lower side edge to the upper side edge.

Therefore, the air injector 400 includes the upper air injection pipe 20 provided at the upper side edge of the transmission window 10 and the lower air injection pipe 30 provided at the lower side edge of the transmission window 10.

Figure 5:
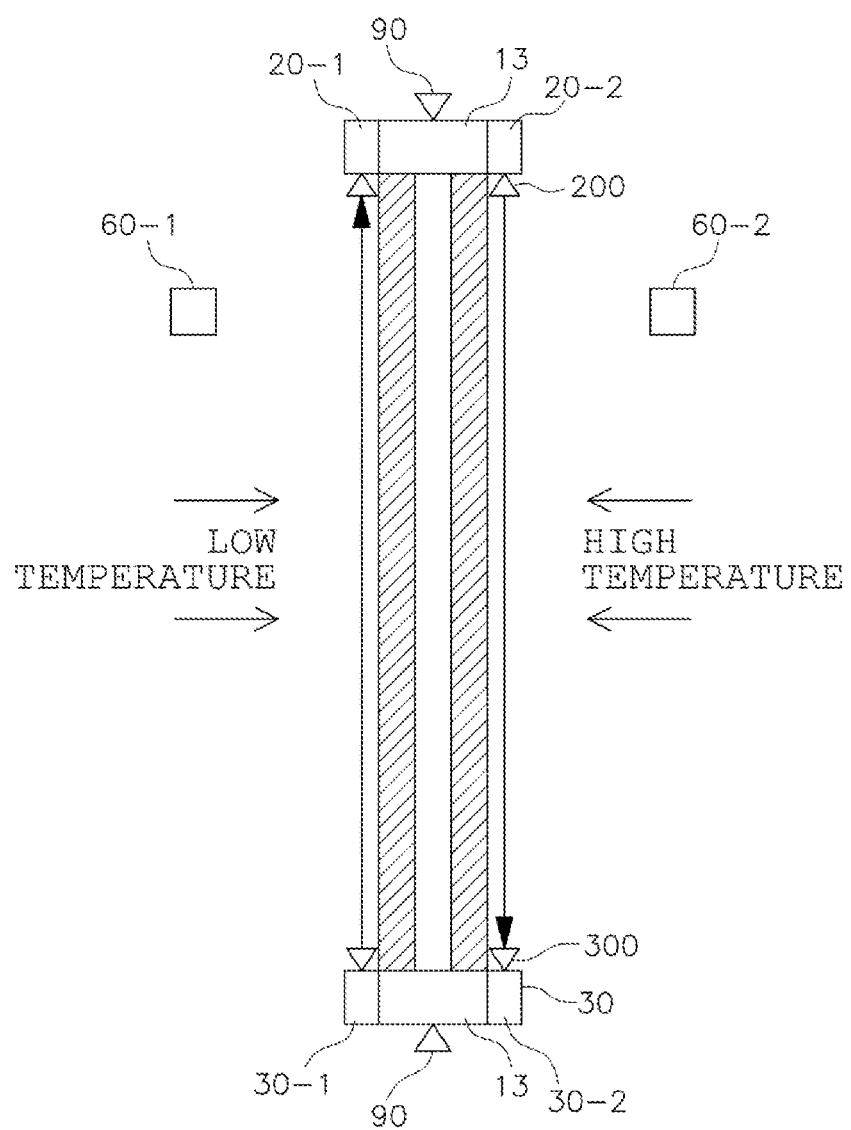
FIG. 5 is a schematic diagram showing a sectional structure of the transmission window according to the embodiment of the present invention.

In addition, as shown in FIGS. 3 and 5, since the upper air injection pipe 20 and the lower air injection pipe 30 are provided on the opposite side surfaces of the transmission window 10, the upper air injection pipe 20 is shown by being divided into a first side upper air injection pipe 20-1 and a second side upper air injection pipe 20-2, and the lower air injection pipe 30 is shown by being divided into a first side lower air injection pipe 30-1 and a second side lower air injection pipe 30-2.

According to the present invention, when the transmission window 10 is mounted to the CMS module test chamber 100, the first side upper air injection pipe 20-1 and the first side lower air injection pipe 30-1 are individually controlled at a first side surface of the transmission window 10, and the second side upper air injection pipe 20-2 and the second side lower air injection pipe 30-2 are individually controlled at a second side surface thereof.

One side of the transmission window 10 faces toward the inside of the CMS module test chamber 100 and the other side thereof faces toward the outside thereof. However, since operational methods of the air injectors on the opposite side surfaces are equal to each other, the upper and lower air injection pipes on the opposite side surfaces 20-1, 20-2, 30-1, and 30-2 will be described below by unifying the upper air injection pipe 20 and the lower air injection pipe 30.

As shown in FIG. 3, the upper air injection pipe 20 is configured of air injection nozzles 200 formed at equal intervals on an air pipe provided along the upper side edge of the transmission window 10. The lower air injection pipe 30 is configured of air injection nozzle 300 formed at equal intervals on an air pipe provided along the lower side edge of the transmission window 10.

The nozzles 200 and 300 for injecting air are formed in through holes arranged at the equal intervals in the embodiment of FIG. 3, but may be variable according to a level of the known art.

As shown in FIG. 5, the air injector 400 forms an air curtain on the transmission window 10 so that inside air or outside air of the CMS module test chamber 100 is prevented from being in contact with a surface of the transmission window 10.

Referring to a left side in FIG. 5, the air injector 400 injects air through the lower air injection pipe 30 from the lower side edge of the transmission window 10 to the upper side edge thereof. This is to form the air curtain by injecting air warmer than outside air of the transmission window 10 when the outside temperature of the transmission window 10 is low.

Likewise, when the air warmer than the outside air is injected from the lower side edge of the transmission window 10, the air curtain is naturally formed at the surface of the transmission window 10 due to natural convection.

In particular, pressure difference generated between warm air and cold air in a short time forms a pressure trough therebetween, thus the air curtain is firmly maintained, and prevents the surface from contacting with the outside air.

According to the present invention, air walls 14 are installed by protruding from left and right sides on the opposite side surfaces of the transmission window 10 in order to form and maintain the air curtains, as shown in FIG. 3. Thus, air injected to the surfaces of the transmission window 10 forms air layers by the air walls 14.

That is, the air walls 14 prevent the air injected to the transmission window 10 from dispersing out of the transmission window 10, and direct the air to reach the opposite edges along the surfaces of the transmission window 10.

As described above, temperature difference between the injected air and the outside air of the transmission window 10 prevents air mixing and forms the air curtains, and thicknesses of the air curtains are formed in proportion to thicknesses of the air walls 14.

Referring to a right side in FIG. 5, the air injector 400 injects air through the upper air injection pipe 20 from the upper side edge of the transmission window 10 to the lower side edge thereof. This is to dehumidify a surface of the transmission window 10 when the outside temperature thereof is high.

When air at a temperature lower than the outside temperature of the transmission window 10 is injected from the upper side edge, the air curtain is naturally formed at the surface of the transmission window 10 due to the natural convection at the surface thereof. At this time, temperature difference between warm air and cold air also strengthens the air curtain formed at the surface of the transmission window 10, thereby preventing the surface from contacting with the outside air.

Meanwhile, according to the present invention, the temperature of the transmission window 10 for the CMS module test chamber 100 varies greatly depending on test environment. The inside temperature of the CMS module test chamber 100 varies greatly from −40° C. to +125° C.

Temperature difference between the inside and outside of the CMS module test chamber 100 varies depending on the test environment in the CMS module test chamber 100. Thus, a situation in which the inside temperature of the CMS module test chamber 100 is significantly higher or lower than the outside temperature thereof is repeated.

Accordingly, the temperatures of air contacting with the transmission window 10 at positions inside and outside the CMS module test chamber 100 vary rapidly depending on the test environment of the CMS module test chamber 100. Therefore, there is a need to selectively inject cold air and warm air in response to the test environment in the CMS module test chamber 100.

For the purpose, in the present invention, the upper air injection pipe 20 and the lower air injection pipe 30 are preferably formed on both the upper and lower side edges of the transmission window 10.

Further, for selective injection of cold air and warm air, the present invention is configured to inject air at a fixed temperature from the upper air injection pipe 20 and the lower air injection pipe 30 through the one main air flow path 40, as shown in FIG. 4. The flow path selection control valve 50 is provided at a branching point where air is branched into the upper air injection pipe 20 and the lower air injection pipe 30 from the main air flow path 40.

The flow path selection control valve 50 controls an air path into the upper air injection pipe 20 and the lower air injection pipe 30 in response to a control signal.

Noun According to the configuration, the flow path selection control valve 50 is controlled depending on inside and outside temperatures of the transmission window 10. When the outside temperature of the transmission window 10 is lower than the temperature of injected air, the flow path selection control valve 50 is controlled to inject air from the lower air injection pipe 30. When the outside temperature thereof is higher than the temperature of the injected air, the flow path selection control valve 50 is controlled to inject air from the upper air injection pipe 20. Whereas the air curtains may be spread out on the transmission window 10.

That is, according to the present invention, depending on the test environment of the CMS module test chamber 100, it is possible to perform dehumidifying or freezing prevention on the surfaces of the transmission window 10 inside and outside the CMS module test chamber 100.

Figure 6:
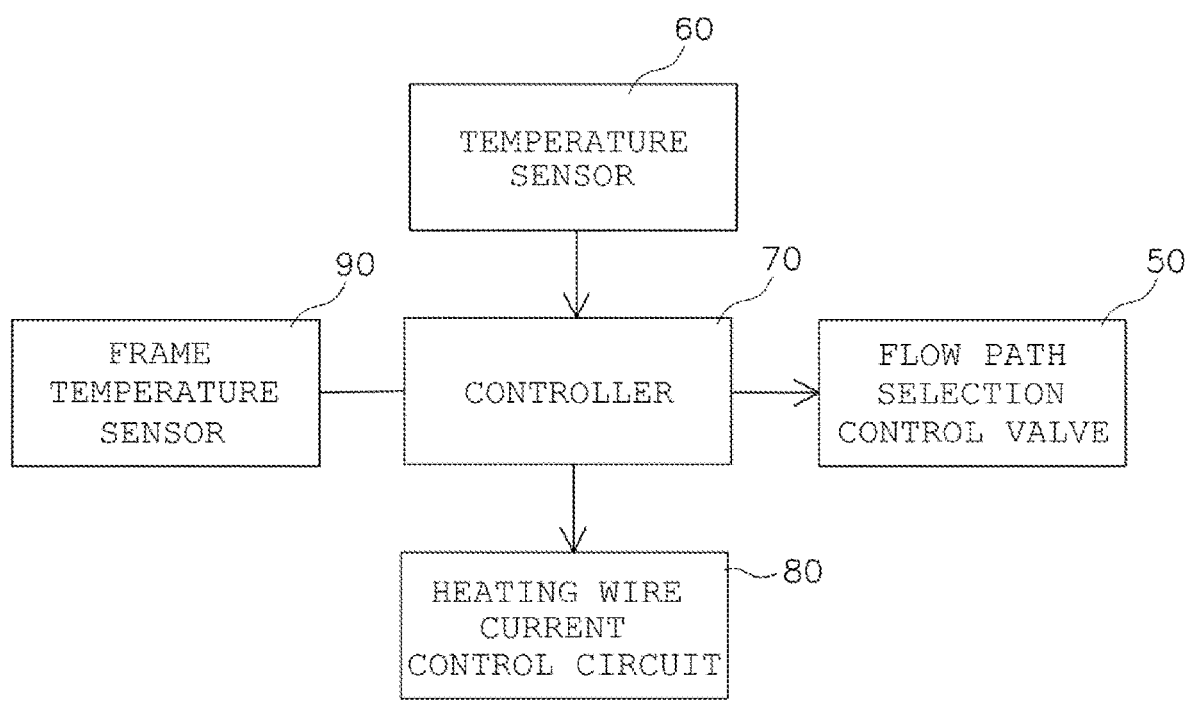
FIG. 6 is a control block diagram of the present invention.

Meanwhile, the transmission window 10 of the present invention includes: the temperature sensor 60 provided at opposite sides of the transmission window 10 for automatic control of the flow path selection control valve 50, as shown in FIG. 5; and the controller 70 receiving sensing information of the temperature sensor 60 and outputting a path switching command to the flow path selection control valve 50, as shown in FIG. 6.

The temperature sensor 60 is provided at each of the inside and outside of the CMS module test chamber 100 to control directions of the air to be independently injected to the transmission window 10 inside and outside of the CMS module test chamber 100.

That is, the temperature sensor 60 senses inside and outside temperatures of the CMS module test chamber 100 and transmits the sensing information to the controller 70. The controller 70 outputs a control signal to the flow path selection control valve 50 in response to the sensed temperature so that the air flow path is selected.

Therefore, in the summer, when the inside temperature of the CMS module test chamber 100 is high, cold air may be injected from the upper air injection pipe 20 to the lower side edge simultaneously inside and outside of the CMS module test chamber 100. In the winter, when the inside temperature of the CMS module test chamber 100 is low, cold air may be injected from the lower air injection pipe 30 to the upper side edge simultaneously inside and outside of the CMS module test chamber 100.

However, at any season, an air injection direction outside the CMS module test chamber 100 may be controlled to be fixed on the basis of a the same temperature as the room temperature, and the air injection direction in the CMS module test chamber 100 may be controlled to vary in response to the temperature variation according to the inside test environment.

Further, the transmission window frame 13 of the present invention includes: the heating wire current control circuit 80 that is configured to control heating temperatures of the heating wires 11 in response to a control command of the controller 70; and the frame temperature sensor 90 checking temperature of the transmission window frame 13.

The heating temperatures of the heating wires 11 may be controlled corresponding to temperature variation of the CMS module test chamber 100 as described above.

That is, since the temperature of the transmission window frame 13 is not maintained constantly but varies depending on ambient temperature, an integrated database is formed of the best temperature of the transmission window frame 13 depending on an ambient temperature so that the temperature of the transmission window frame 13 may be automatically controlled.

In addition, an optimum temperature of the transmission window 10 depending on the temperature of air injected to the inside and the outside of the transmission window 10 is calculated. As a result, the temperature of the transmission window frame 13 may be maintained depending on levels of the outside temperature of the transmission window and the temperature of injected air, so that it is possible to prevent fogging or freezing at a peripheral portion of the transmission window 10 generated by transmitting inside and outside temperatures of the CMS module test chamber 100 through the transmission window frame 13.

Although the embodiment of the present invention has been described for illustrative purposes, and it should be understood that various combinations are possible in order to realize the gist of the present invention as shown in the drawings.

Accordingly, the present invention is not limited to the embodiment disclosed in the description, and those skilled in the art will appreciate that various modifications, additions and substitutions are possible, without departing from the scope and spirit of the invention as disclosed in the accompanying claims.

What is claimed is:

1. A condensation prevention type transmission window for a camera monitor system module test chamber, the transmission window being provided at the module test chamber, wherein the transmission window comprises:
    a multilayer glass panel in which heating wires are provided on upper, lower, left, and right side surfaces thereof,
    wherein the transmission window is coupled with an air injector to form an air curtain on the transmission window,
    wherein the air injector comprises;
        an upper air injection pipe provided at an upper side edge of the transmission window and having a nozzle for injecting air toward a lower side of the transmission window;
        a lower air injection pipe provided at a lower side edge of the transmission window and having a nozzle for injecting air toward an upper side of the transmission window; and
        a flow path selection control valve provided at a branching point on a main air flow path for distributing air into the upper air injection pipe and the lower air injection pipe,
    wherein the flow path selection control valve is controlled on the basis of temperature of air contacting with the transmission window, such that when the temperature is low, air is injected from the lower air injection pipe, and when the temperature is high, air is injected from the upper air injection pipe, so the air curtain is spread out on the transmission window.

2. The condensation prevention type transmission window of claim 1, further comprising:
    a temperature sensor provided at each of opposite sides of the transmission window to sense temperature; and
    a controller receiving sensing information of the temperature sensor and outputting a path switching command to the flow path selection control valve,
    wherein an air injection flow path is automatically selected by the flow path selection control valve on the basis of temperatures of air contacting with the opposite surfaces of the transmission window, and air injectors on the opposite surfaces are individually controlled from each other on the basis of the temperatures of air contacting with the opposite surfaces of the transmission window.

3. The condensation prevention type transmission window of claim 2, further comprising:
    a heating wire current control circuit configured to control heating temperatures of the heating wires in response to a control command of the controller; and
    a frame temperature sensor checking a temperature of a transmission window frame,
    wherein the temperature of the transmission window frame is controlled by the controller.

4. The condensation prevention type transmission window of claim 1, wherein the transmission window further comprises:
    air walls protruding from left and right sides of the opposite surfaces thereof to allow injected air to form air layers.

* * * * *